(12) United States Patent
Nishizawa et al.

(10) Patent No.: US 7,516,903 B2
(45) Date of Patent: Apr. 14, 2009

(54) IC CARD

(75) Inventors: Hirotaka Nishizawa, Fuchu (JP);
Haruji Ishihara, Kawaguchi (JP);
Atsushi Shiraishi, Kodaira (JP); Yosuke Yukawa, Kokubunji (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 11/399,396

(22) Filed: Apr. 7, 2006

(65) Prior Publication Data

US 2006/0183355 A1    Aug. 17, 2006

Related U.S. Application Data

(63) Continuation of application No. 10/352,886, filed on Jan. 29, 2003, now Pat. No. 7,044,389, which is a continuation of application No. 10/258,174, filed as application No. PCT/JP00/02823 on Apr. 28, 2000, now Pat. No. 6,669,487.

(51) Int. Cl.
*G06K 19/06* (2006.01)

(52) U.S. Cl. ...................... 235/492; 235/487

(58) Field of Classification Search .................. 235/492, 235/487
See application file for complete search history.

(56) References Cited

U.S. PATENT DOCUMENTS

| | | | |
|---|---|---|---|
| 3,934,122 A | 1/1976 | Riccitelli | 235/380 |
| 4,843,226 A | 6/1989 | Kato et al. | 235/492 |
| 5,237,609 A | 8/1993 | Kimura | 235/380 |
| 5,398,154 A | 3/1995 | Perkins et al. | 361/212 |
| 5,564,933 A | 10/1996 | Bouchan et al. | 439/76.1 |
| 5,729,717 A | 3/1998 | Tamada et al. | 711/164 |
| 5,772,448 A | 6/1998 | Ekrot et al. | 439/60 |
| 5,784,259 A | 7/1998 | Asakura | 361/752 |
| 5,825,882 A | 10/1998 | Kowalski et al. | 713/172 |
| 5,828,753 A * | 10/1998 | Davis | 713/189 |
| 6,094,724 A | 7/2000 | Benhammou et al. | 902/26 |
| 6,315,195 B1 | 11/2001 | Ramachandran | 235/380 |
| 6,341,085 B1 | 1/2002 | Yamagami et al. | |
| 6,386,920 B1 | 5/2002 | Sun | 439/630 |
| 6,401,208 B2 * | 6/2002 | Davis et al. | 713/193 |

(Continued)

FOREIGN PATENT DOCUMENTS

EP          950 982         10/1999

(Continued)

*Primary Examiner*—Karl D Frech
(74) *Attorney, Agent, or Firm*—Miles & Stockbridge P.C.

(57) ABSTRACT

A multifunction IC card (MFC) has compatibility with a multimedia card, an SD card, etc. in that connector terminals (#1 through #13) are disposed on a card substrate (1) in two rows in a zigzag fashion, and realizes multifunction facilities in that a memory card unit (3) and an SIM (Subscriber Identity Module) card unit (4) are respectively connected and mounted to predetermined terminals of the connector terminals (#1 through #13). The memory card unit (3) and the SIM card unit (4) are respectively separately provided with areas for storing secret codes for security. Thus, one IC card is capable of implementing multifunction facilities different in security level. Owing to the adoption of a plural-column layout corresponding to a form typified by the zigzag fashion in an array of the connector terminals, a relatively simple structure can be adopted in a card slot.

6 Claims, 8 Drawing Sheets

U.S. PATENT DOCUMENTS

| | | | |
|---|---|---|---|
| 6,468,101 B2 | 10/2002 | Suzuki | 439/326 |
| 6,537,081 B2 | 3/2003 | Lai et al. | 439/66 |
| 6,606,707 B1 | 8/2003 | Hirota et al. | 713/172 |
| 6,612,492 B1 | 9/2003 | Yen | 235/451 |
| 6,612,498 B1 | 9/2003 | Lipponen et al. | 235/486 |
| 6,669,487 B1 | 12/2003 | Nishizawa et al. | 439/60 |
| 6,896,523 B2 | 5/2005 | Nishizawa et al. | 439/60 |

FOREIGN PATENT DOCUMENTS

| | | |
|---|---|---|
| JP | 63-9586 | 1/1988 |
| JP | UM2-61680 | 5/1990 |
| JP | 5-57635 | 8/1993 |
| JP | 5-204561 A | 8/1993 |
| JP | 9-259045 | 10/1997 |
| JP | 10-334205 | 12/1998 |
| JP | 11-273400 | 10/1999 |
| JP | 2001-209773 | 8/2001 |

\* cited by examiner

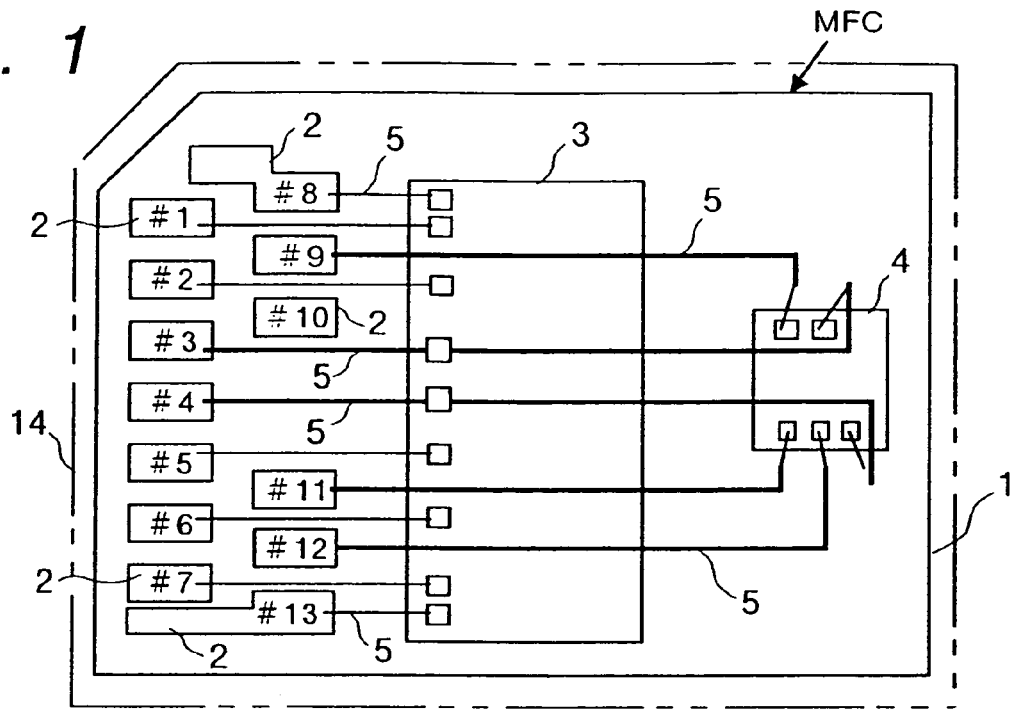

| pin # | 7pin (1bit) | 9pin (4bit) | 13pin (A) | 13pin (B) |
|---|---|---|---|---|
| 1 | (CS) NC | Data3 | (CS-1) NC-1 | Data3 |
| 2 | (Din) CMD | CMD | (Din-1) CMD-1 | CMD-1 |
| 3 | Vss1 | Vss1 | Vss1 | Vss1 |
| 4 | Vdd | Vdd | Vdd | Vdd |
| 5 | CLK | CLK | CLK-1 | CLK-1 |
| 6 | Vss2 | Vss2 | Vss2 | Vss2 |
| 7 | (Dout) Data | Data0 | (Dout-1) Data-1 | Data0 |
| 8 | - | Data2 |  | Data2 |
| 9 | - | - | (CS-2) NC-2 | NC-2 |
| 10 | - | - | (Din-2) CMD-2 | • CMD-2 |
| 11 | - | - | CLK-2 | • CLK-2 |
| 12 | - | - | (Dout-2) Data-2 | • Data-2 |
| 13 | - | Data1 |  | Data1 |

FIG. 13
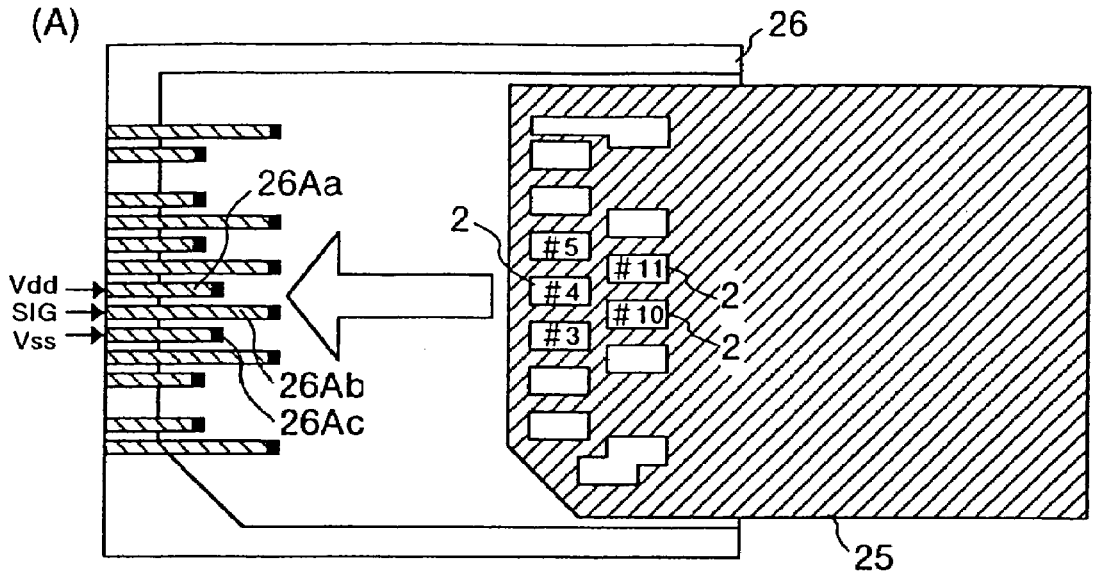
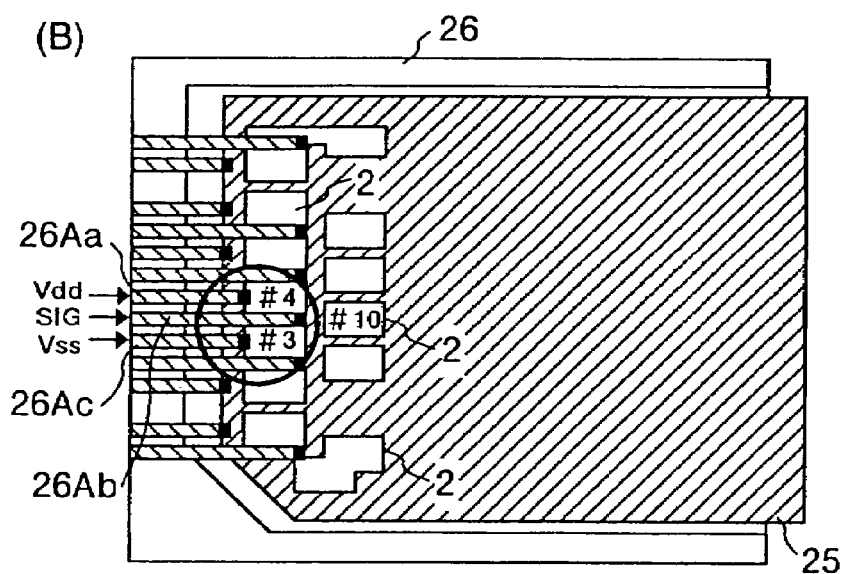
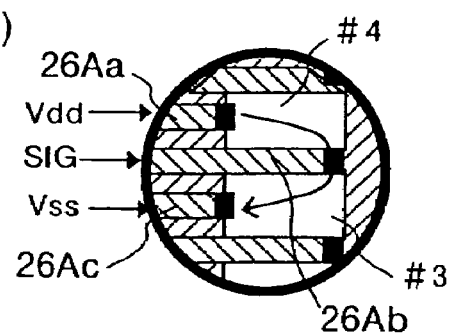

IC CARD

CROSS-REFERENCE TO RELATED APPLICATION

This application is a continuation of application Ser. No. 10/352,886 filed Jan. 29, 2003 now U.S. Pat. No. 7,044,389, which is a continuation of application Ser. No. 10/258,174 filed Oct. 22, 2002 (now U.S. Pat. No. 6,669,487 issued Dec. 30, 2003), which is a 371 of PCT/JP00/02823 filed Apr. 28, 2000.

TECHNICAL FIELD

The present invention relates to maintenance of compatibility in an IC card and its function expansion, and to, for example, a technology effective for application to an IC card for implementing a multibank or a multifunction while compatibility with a multimedia card being maintained.

BACKGROUND ART

With a view toward executing transmission of information between a cellular phone and a digital network device, or the like, a memory card like a multimedia card has been proposed which has implemented a reduction in size and weight and simplification of an interface. As described in, for example, the Interface (December issue in 1999) issued by CQ Publishing Co., Ltd., a multimedia card has seven connector terminals as external interface terminals and adopts a serial interface. This is capable of reducing a load on a host system as compared with an ATA interface adopted by a PC card or hard disk and is available even for a simpler system. Further, the same reference has also described that an SD card has been proposed as an upper compatible memory card of the multimedia card.

The present inventors have discussed a function expansion of a storage-system IC card such as a multimedia card or the like. Thus, the present inventors have previously filed the invention wherein extension terminals are provided while compatibility is being maintained with respect to a standardized terminal array of a multimedia card or the like, thereby enabling a function expansion such as an increase in the number of data bits (Unexamined Patent Application No. 2000-18030). Further, the present inventors have carried out discussions directed toward the implementation of a multibank or multifunction using such extension terminals. In a GSM (Group Special Mobile) mobile communication system or the like using an SIM (Subscriber Identity Module) of an IC card, for example, an SIM card has a single chip microcomputer or the like, which stores subscriber information and account information or the like necessary for subscriber acknowledgement and management for security and realizes communication protocols, and which builds therein a nonvolatile memory such as a flash memory, for example. When one attempts to apply a storage card such as a multimedia card to a cellular phone of such a GSM mobile communication system, an insertion slot for the storage card is required in addition to one for the SIM card. Thus, the present inventors have found that there is room for improvements in terms of space factors. Further, the present inventors have found that a difference in security level unavoidably occurs in memory information between the storage card and the SIM card and hence there is a necessity that the difference in security level is allowable as a difference upon the multifunction.

An object of the present invention is to provide an IC card capable of executing a function expansion such as a multibank or multifunction or the like while compatibility with a predetermined standard is being maintained with respect to a terminal array.

Another object of the present invention is to provide an IC card capable of expanding multifunctions different in security level.

The above, other objects and novel features of the present invention will become apparent from the following description of the present specification and the accompanying drawings.

DISCLOSURE OF THE INVENTION

[1] An IC card according to the present invention takes into consideration compatibility and a function expansion thereof. As to the compatibility of the IC card, upward compatibility and downward compatibility are maintained. The upward compatibility is that a downward IC card can be used by being inserted into a card slot of an upward IC card, for example. The downward compatibility is that the IC card can be used by being inserted into a card slot of the downward IC card, for example. An IC card has a first functional block and a second functional block each comprising a semiconductor integrated circuit and has a configuration wherein a plurality of connector terminals are exposed.

In terms of the compatibility of the IC card, the plurality of connector terminals are disposed in plural rows in a zigzag fashion between columns adjacent to one another back and forth as viewed in an insertion direction of the IC card. If an expression different from one for the zigzag placement thereof is taken, then the plurality of connector terminals have an array of two columns formed back and forth as viewed in an IC card insertion direction, and an array of terminal-to-terminal areas between the connector terminals disposed in a first column, and terminal-to-terminal areas between the connector terminals disposed in a second column are shifted from each other in a column direction. If a further different expression is made to the zigzag layout, then the plurality of connector terminals have an array of two columns formed back and forth as viewed in an IC card insertion direction, and a column-direction layout of the connector terminals disposed in a first column and a column-direction layout of the connector terminals disposed in a second column are shifted from each other in a column direction.

Owing to the adoption of a plural-column layout corresponding to a form typified by the zigzag fashion in an array of the connector terminals, a relatively simple structure can be adopted in a card slot, wherein a large number of slot terminals thereof are alternately disposed in parallel while the amounts of protrusion thereof are being changed. A connector terminal array of a downward IC card is adopted in a specific connector terminal array of the IC card as it is. On the other hand, if a function dedicated to an upward IC card is assigned to another zigzag connector terminal array, then such downward compatibility that the upward IC card is made available by being mounted in a card slot of the downward IC card, can be also realized.

In terms of the function expansion of the IC card, the connector terminals of the card include a first connector terminal connected and dedicated to the first functional block, a second connector terminal connected and dedicated to the second functional block, and a third connector terminal sharing an operating power supply commonly to both the first functional block and the second functional block. By dedicating data terminals or the like other than a power supply to the first functional block and the second functional block respectively, the implementation of the upward compatibility and downward compatibility are facilitated.

When one attempts to achieve compatibility between three generations or IC cards of three types or more, such a case that a connector terminal array of a first IC card is adopted for a connector terminal column corresponding to a first column as it is, whereas a dedicated function added to a second IC card is assigned to a connector terminal column corresponding to another zigzag second column, and dedicated functions added to a third IC card are assigned to both the specific terminal column corresponding to the first column and the connector terminal column corresponding to the second column, is assumed. At this time, the implementation of upward compatibility and downward compatibility between the second IC card and the third IC card is taken into consideration. To this end, a structure is adopted in which the connector terminal at one end extending in a column direction of the connector terminals disposed in the second column extends to a position where the connector terminal adjoins, in a column direction, the connector terminal disposed in the first column and placed at one end extending in a column direction of the connector terminals thereof, and the connector terminal at the other end extending in a column direction of the connector terminals disposed in the second column extends to a position where the connector terminal adjoins, in a column direction, the connector terminal disposed in the first column and placed at the other end extending in a column direction of the connector terminals thereof. According to it, such compatibility that the first to third IC cards are mutually inserted even in a slot of any of other IC cards and made available, can be easily realized.

[2] The function expansion of the IC card is intended for a multibank memory, for example. At this time, the first functional block is a first memory card unit including an electrically rewritable first non-volatile memory, and a first controller which performs access control on the first non-volatile memory in accordance with instructions supplied from the first connector terminal and control on an interface with the outside via the first connector terminal. The second functional block is a second memory card unit including an electrically rewritable second non-volatile memory, and a second controller which performs access control on the second non-volatile memory in accordance with instructions supplied from the second connector terminal and control on an interface with the outside via the second connector terminal.

If the multimedia card or the like placed under the present situation is taken into consideration although a specific function of each connector terminal is arbitrary, then the first connector terminal includes a clock terminal and a data terminal, the second connector terminal includes a clock terminal and a data terminal, and the third connector terminal includes a source voltage supply terminal and a ground voltage supply terminal.

The first memory card unit and the second memory card unit are configured as a parallel operable multibank memory unit.

In order to increase security of data stored in each nonvolatile memory, the first controller may have a security function for encrypting data written into the first non-volatile memory and decrypting data read from the first non-volatile memory or effecting other encryption on the data, and the second controller may have a security function for encrypting data written into the second non-volatile memory and decrypting data read from the second non-volatile memory or effecting other encryption on the data.

[3] The function expansion of the IC card is intended for a multifunction. At this time, the first functional block is a first data processing unit provided with a first non-volatile memory, and a first controller which performs access control on the first non-volatile memory and performs control on an interface with the outside via the first connector terminal. The second functional block is a second data processing unit provided with a second non-volatile memory, and a second controller which performs access control on the second non-volatile memory and performs control on an interface with the outside via the second connector terminal. The first data processing unit and the second data processing unit respectively have areas for storing secret codes for security, separately.

Thus, one IC card is capable of realizing multifunction facilities different in security level.

The first data processing unit makes possible even writing of a secret code into a secret code storage area at a non-volatile memory manufacturing stage. The second data processing unit makes possible even writing of a secret code into a secret code storage area at a manufacturing stage of the IC card. Thus, the setting of the secret code is made possible by a method or a procedure necessary to maintain security, according to the difference in security level. When, for example, the first data processing unit is set as a memory card unit of a general data storage application, and the second data processing unit is set as a microcomputerized SIM card unit, the security for the second data processing unit for processing/managing account information must be unavoidably kept strict as compared with the first data processing unit, thus making it possible to meet such a demand sufficiently.

Even when the first data processing unit is configured as the memory card unit of the general data storage application, the first controller may preferably adopt a security function for encrypting data written into the first non-volatile memory and decrypting data read from the first non-volatile memory or effecting other encryption on the data with a view toward enhancing effectivity of copyright protection or the like of data stored in the memory card unit.

When the memory card unit and the SIM card unit or the like are adopted as the multifunction facilities, e.g., the first connector terminal includes a clock terminal, data terminals of plural bits and a command terminal of one bit, the second connector terminal includes a clock terminal, a data terminal and a reset terminal, and the third connector terminal includes a source voltage supply terminal and a ground voltage supply terminal.

[4] When a connector terminal for source voltage supply is disposed in a connector terminal column corresponding to a first column as viewed in an IC card insertion direction, a connector terminal column corresponding to a second column is formed with a terminal-to-terminal area at a position adjacent to the source voltage supply connector terminal. If other connector terminals adjacent to the source voltage supply connector terminal are disposed in the connector terminal column corresponding to the second column in a zigzag form, there is a possibility that slot terminals of a card slot corresponding to the other connector terminals will contact both a source supply connector terminal and other connector terminals located ahead of the other connector terminals in the course of the insertion of an IC card into the card slot before the slot terminals contact the other connector terminals. If a power-supply or source slot terminal is already brought into contact with the source voltage supply connector terminal in this state, there is then the fear of a power-to-power short. If a structure for ensuring the terminal-to-terminal area is adopted, then means for increasing the distance between the connector terminal columns corresponding to the first and second columns and narrowing the width of each connector terminal may not be taken.

BRIEF DESCRIPTION OF THE DRAWINGS

FIG. 1 is an explanatory view showing a configuration of a multifunction IC card illustrative of one example of an IC card according to the present invention with a form of connections between connector terminals and circuit units as a principal base;

FIG. 2 is an explanatory view illustrating a list of connector terminal functions of the multifunction IC card;

FIG. 13 is an explanatory view showing, as a comparative example, a connector terminal array in which a power-to-power short is developed.

BEST MODE FOR CARRYING OUT THE INVENTION

<<Multifunction IC Card>>

Figure 3:
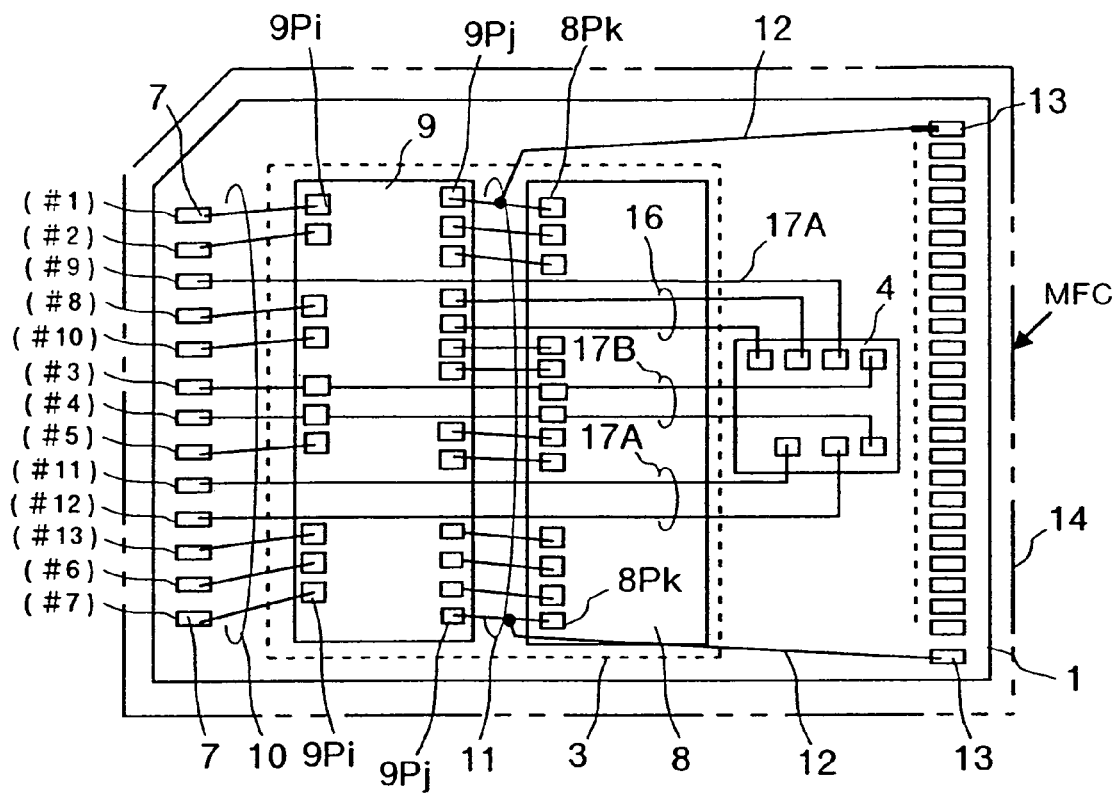
FIG. 3 is a plan view illustrating an actual state of a circuit mounting surface of a multifunction IC card.

FIG. 1 shows a configuration of a multifunction IC card corresponding to one example of an IC card according to the present invention with a form of connections between connector terminals and circuit units as a principal base.

The multifunction IC card MFC shown in FIG. 1 has compatibility with a multimedia card, an SD card or the like in that connector terminals 2 (#1 through #13) for a card substrate 1 are disposed in two rows in a zigzag form, and realizes multifunction facilities in that a memory card unit 3 and an SIM card unit 4 are respectively mounted with being exclusively connected to predetermined terminals of the connector terminals 2 (#1 through #13). Reference numerals 5 indicate connecting wirings that show a generic designation for wiring patterns, bonding wires, etc. for connecting the memory card unit 3 and the SIM card unit 4 to the connector terminals 2.

Here, the multifunction IC card MFC is assumed to be an application available with being mounted to a cellular telephone. The memory card unit 3 is configured as a data storage application which has a non-volatile memory like an electrically rewritable flash memory whose details will be described later, and a controller, and stores telephone directory data, incoming melody data, etc. therein. The SIM card unit 4 comprises a microcomputer with a built-in flash memory, for realizing storage of subscriber information and account information necessary for subscriber acknowledgement and management for security for a GSM cellular phone or the like.

While the connector terminals 2 of #1 through #13 are illustrated in FIG. 1 as if directly connected to the memory card unit 3 and the SIM card unit 4, the connector terminals 2 of #1 through #13 are actually disposed on the back surface (terminal surface) of the card substrate 1, connecting pads connected to their corresponding connector terminals by through holes or wiring patterns are provided on the surface (mounting surface) of the card substrate, and the memory card unit 3 and the SIM card unit 4 are connected to these connecting pads.

The multifunction IC card MFC is based on the size of the multimedia card and conforms to a standard in which its thickness thereof is 1.4 mm and its plane size is 24 mm×32 mm. The card substrate 1 of the multifunction IC card is configured such that the connector terminals 2 of #1 through #13 are disposed on a terminal surface of a substrate made up of a resin substrate such as a glass epoxy resin or the like in two rows between rows adjacent to one another backward and forward as viewed in a card insertion direction (its longitudinal direction).

The connector terminals 2 of #1, #2, #5 through #8 and #13 are connected to the memory card unit 3, the connector terminals 2 of #9, #11 and #12 are connected to the SIM card unit 4, and the connector terminals 2 of #3 and #4 for the supply of operating power supplies are commonly connected to both the memory card unit 3 and the SIM card unit 4.

The connector terminals 2 of #1 through #7 respectively have layouts and functions based on a multimedia card standard. A multimedia card mode and an SPI (Serial Peripheral Interface) mode are generally used for the multimedia card. The selection of the operating modes is determined depending on the state of a predetermined terminal at power-on. Terminal functions of the multimedia card are illustrated in the column of 7 pin (1 bit) in FIG. 2. A point of difference between the multimedia card mode and the SPI mode is shown in parentheses. In the multimedia card mode, #1 functions as a reserve terminal NC (open or fixed to a logical value "1"), #2 functions as a command terminal CMD (which performs the input of a command and the output of a response signal), #3 and #6 respectively function as circuit ground voltage (ground) terminals Vss1 and Vss2, #4 functions as a source voltage supply terminal Vdd, #5 functions as a clock input terminal CLK, and #7 functions as a data input/output terminal Data, respectively. In the SPI (Serial Peripheral Interface) mode, #1 functions as a chip select terminal CS (negative logic), #2 functions as a data input terminal Din (used for the input of data and a command from a host device to the card), #3 and #6 respectively function as the circuit ground voltage (ground) terminals Vss1 and Vss2, #4 functions as the source voltage supply terminal Vdd, #5 functions as the clock input terminal CLK, and #7 functions as a data output terminal Dout (which performs the output of data and status from a memory card to the host device), respectively. The multimedia card mode is an operating mode suitable for a system which simultaneously uses a plurality of multimedia cards. In order to identify the corresponding multimedia card, a card identification ID (relative address) set to the multimedia card in an initial sequence thereof by an unillustrated host device is used. The SPI mode is most suitable for the utilization in a simple and low-cost system. The selection of the multimedia card is performed according to a chip select signal supplied to the connector terminal of #1 from the host device. In any operating mode, the controller of the memory card unit 3 performs access control to a memory chip and control on an interface with the host device in response to a command supplied from the host device.

The connector terminals 2 of #8 through #13 are placed as extension terminals with respect to the multimedia card. The connector terminals 2 of #1 through #7 constitute a connector terminal array corresponding to a first row with respect to the card substrate 1, and the added connector terminals 2 of #8 through #13 constitute a connector terminal array corresponding to a second row, which is disposed away from the connector terminal array corresponding to the first row. The connector terminals 2 of #9 through #12 are identical in size to other connector terminals 2. The connector terminal 2 of #13 is placed in the first row and extends up to a position where it perfectly adjoins the connector terminal #7 at one end of the connector terminal array as viewed in its array direction. The connector terminal 2 corresponding to the terminal number #8 is located in the first row and extends up to a position where it partly overlaps with and adjoins the connector terminal #1 of the connector terminal array as viewed in its array direction. The connector terminal array corresponding to the first row and the connector terminal array corresponding to the second array are shifted from each other in the row layout of the connector terminals as viewed in the row direction. In other words, the connector terminals 2 corresponding to the first row and the connector terminals 2 corresponding to the second row are disposed in a zigzag form.

The extension terminals of #8 and #13 are respectively connector terminals made significant when a 4-bit mode shown in the column of 9 pin (4 bit) in FIG. 2 is selected for the multifunction IC card MFC. Namely, when the 4-bit mode is selected, the terminals #2 through #7 are assigned to functions identical to the corresponding multimedia card mode. The terminal #1, which functions as the reserve terminal in the corresponding multimedia card mode, functions as a data terminal Data3 corresponding to a fourth bit, the added terminals #8 and #9 respectively function as a data terminal Data1 corresponding to a second bit and a data terminal Data2 corresponding to a third bit. A data terminal Data0 corresponding to a first bit corresponds to the terminal #7 identical to the multimedia card mode. Thus, when the 4-bit mode is selected for the multifunction IC card MFC, the input/output of data is enabled in 4-bit parallel. At this time, the shapes of the connector terminals 2 of #8 and #13 are set in consideration of compatibility with connector terminals of an SD card. The data terminal functions of #8 and #13 in the 4-bit mode may be transposed. The 4-bit mode is also capable of having compatibility with the SD card.

The memory card unit 3 of the multifunction IC card MFC is provided with a downward compatible mode with respect to the multimedia card. Namely, the controller in the memory card unit 3 has an SPI mode of the multimedia card or a 1-bit mode like the multimedia card mode, and a 4-bit mode in which the input/output of data in 4-bit parallel using the 4-bit data terminals #1, #7, #8 and #13 is performed. The 1-bit mode is an operating mode which allows the multifunction IC card MFC to operate as a multimedia card.

The operating mode may be set in response to the state of a predetermined connector terminal or the state of the input of a command from a predetermined connector terminal. When the multifunction IC card MFC is mounted in a card slot of a multimedia card, the terminals #8 and #13 are brought into floating. Therefore, the controller may detect the floating state of both or any one of the terminals #8 and #13 at power-on to set the 1-bit mode to the multifunction IC card. When it is mounted in a dedicated card slot having slot terminals respectively corresponding to the nine connector terminals 2, the terminals #8 and #9 are caused to conduct into their corresponding slot terminals of the card slot. Therefore, the controller detects the supply of a specific signal or a command from the host device to both or any one of at least the terminals #8 and #9 at power-on, whereby the 4-bit mode may be set to the multifunction IC card MFC.

The extension terminals of #9 through #12 are respectively dedicated terminals connected to the SIM card unit 4. The SIM card unit 4 comprises a single chip microcomputer having built in a non-volatile memory such as a flash memory. #9 indicates a data input/output terminal I/O, #10 indicates a non-connect terminal, #11 indicates a clock terminal CLK, and #12 indicates a reset terminal, respectively. The operating power supplies of the SIM card unit 4 are supplied via the ground terminal Vss of #3 and the power terminal Vdd of #4. If a card slot corresponding to a terminal configuration described in the column of 13 pin in FIG. 2 is provided for a cellular phone or the like and the corresponding multifunction IC card MFC is mounted in the card slot, then the memory card unit 3 and the SIM card unit 4 are capable of operation independent of each other. If the multifunction IC card MFC is connected to a personal computer or the like via a card adapter or the like, then a correction to telephone directory data and the like can be efficiently effected on the memory card unit 3 in the multifunction IC card MFC.

Figure 4:
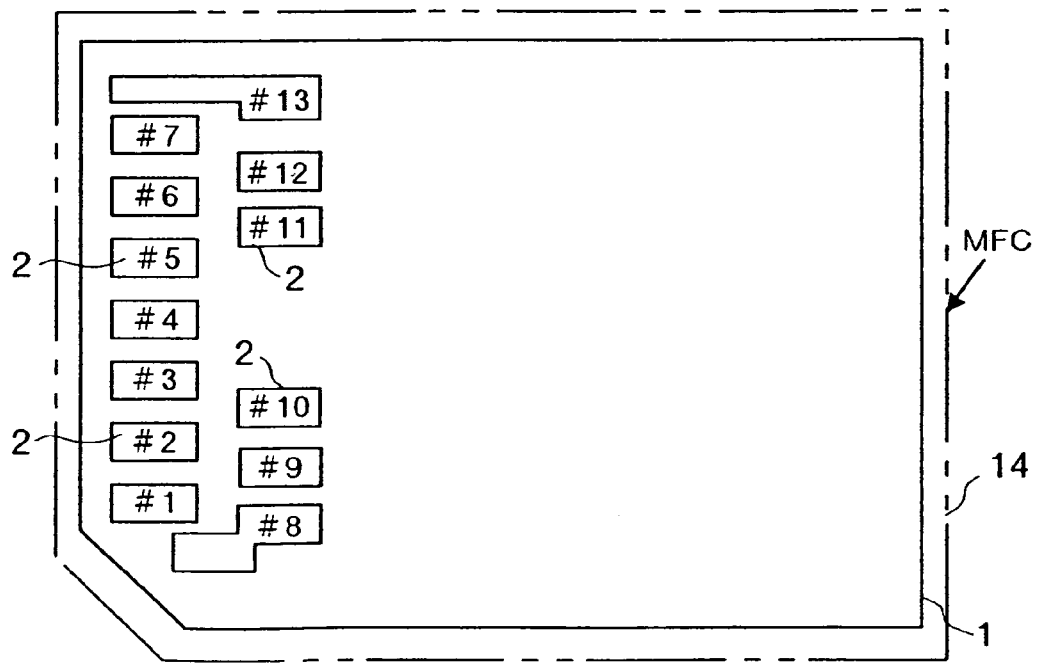
FIG. 4 is a back view illustrating an actual state of a terminal surface of the multifunction IC card.

An actual state of a circuit mounting surface in a multifunction IC card MFC is shown in FIG. 3, and an actual state of a terminal surface is illustrated in FIG. 4. A card substrate 1 of the multifunction card MFC is configured such that connector terminals 2 of #1 through #13 are disposed on a terminal surface of a substrate made up of a resin substrate such as a glass epoxy resin or the like in two rows between rows adjacent to one another backward and forward as viewed in a card insertion direction (its longitudinal direction). Connecting pads 7 are formed on a mounting or packaging surface in a one-to-one correspondence to the connector terminals 2. The connecting pads 7 are respectively formed of conductive patterns such as aluminum, copper or iron alloy or the like. The connector terminals 2 are formed by giving the conductive patterns such as aluminum, copper or iron alloy or the like gold plating or nickel plating or the like. Electrical connections between the connecting pads 7 and the connector terminals 2 are performed by unillustrated wiring patterns on the card substrate 1 and through holes or the like for causing the front and back surfaces of the card substrate 1 to conduct.

A memory card unit 3 has, for example, an electrically rewritable flash memory 8 and a controller 9 for controlling the flash memory 8, which are provided on the mounting surface of the card substrate 1. Although not restricted in particular, the flash memory 8 and the controller 9 are respectively made up of separate semiconductor chips. As a matter of course, both may be made up of one chip together or formed by stacking different chips on each other.

The controller 9 controls a read/write operation for the flash memory 8 in accordance with instructions given from outside via the corresponding connector terminal 2. When data security is taken into consideration, the controller 9 may further be configured so as to have a security function for encrypting data to be written into the flash memory 8, and decrypting data read from the flash memory 8 or effecting another encryption thereon.

The controller 9 has a portrait or vertically-long shape extending along the direction of an arrangement of the connector terminals 2. The controller 9 includes, on the connector terminal 2 side, a plurality of connector interface terminals 9Pi respectively connected to the connector terminals 2 via the connecting pads 7, and on the flash memory 8 side, a plurality of memory interface terminals 9Pj connected to the flash memory 8. The flash memory 8 has on the controller 9 side, a plurality of controller interface terminals 8Pk connected to the controller 9. The connecting pads 7 are connected to their corresponding connector interface terminals 9Pi of the controller 9 by bonding wires 10. The memory interface terminals 9Pj of the controller 9 are connected to their corresponding controller interface terminals 8Pk of the flash memory 8 by bonding wires 11. The connector interface terminals 9Pi respectively have terminal functions corresponding to the #1 through #8 and #13. The memory interface terminals 9Pj are respectively terminals for controlling the flash memory 8, for example and correspond to a plurality of terminals having functions such as a chip enable signal output, a write enable signal output, a command enable signal output, a data input/output, an output enable signal output, a ready/busy signal input, a reset signal output, etc. The controller interface terminals 8Pk are a plurality of terminals having functions such as a chip enable signal input, a write enable signal input, a command enable signal input, a data input/output, an output enable signal input, a ready/busy signal input, a reset signal input, etc. Further, the card substrate 1 includes test terminals 13 connected to the controller 9 and the flash memory 8 by bonding wires (or wiring pattern) 12.

An SIM card unit 4 is connected to connecting pads 7 corresponding to #9, #11 and #12 via bonding wires 17A. Operating power supplies for the SIM card unit 4 are supplied via bonding wires 17B. A pair of bonding wires designated at numeral 16 is interface wirings for connecting the controller 9 and the SIM card unit 4. The pair of bonding wires allows the transfer of information between the memory card unit 3 and the SIM card unit 4.

The card substrate 1 is mounted and fixed to a casing 14 with a mounting surface thereof directed toward its inside. The mounting surface is covered with and protected by the casing 14, and the terminal surface thereof is exposed from the casing 14.

Figure 5:
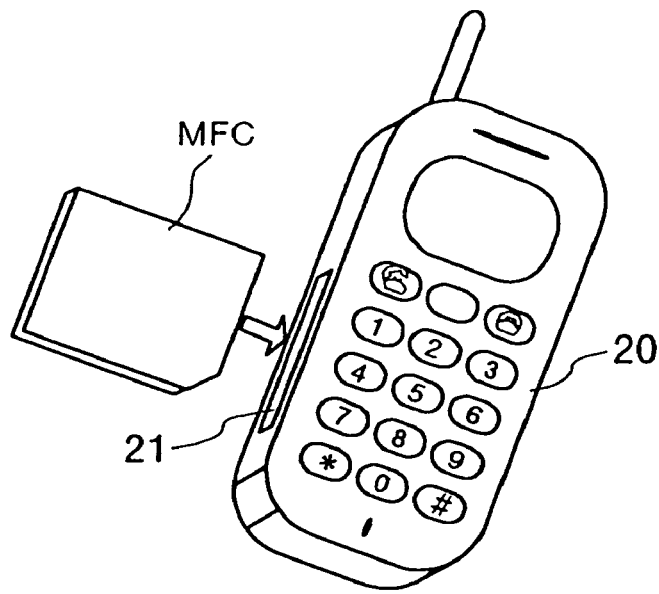
FIG. 5 is a perspective view illustrating an external appearance of a cellular telephone.

An outward appearance of a cellular telephone is illustrated in FIG. 5. The multifunction IC card MFC is mounted in a card slot defined in a side face of the cellular telephone 20.

Figure 6:
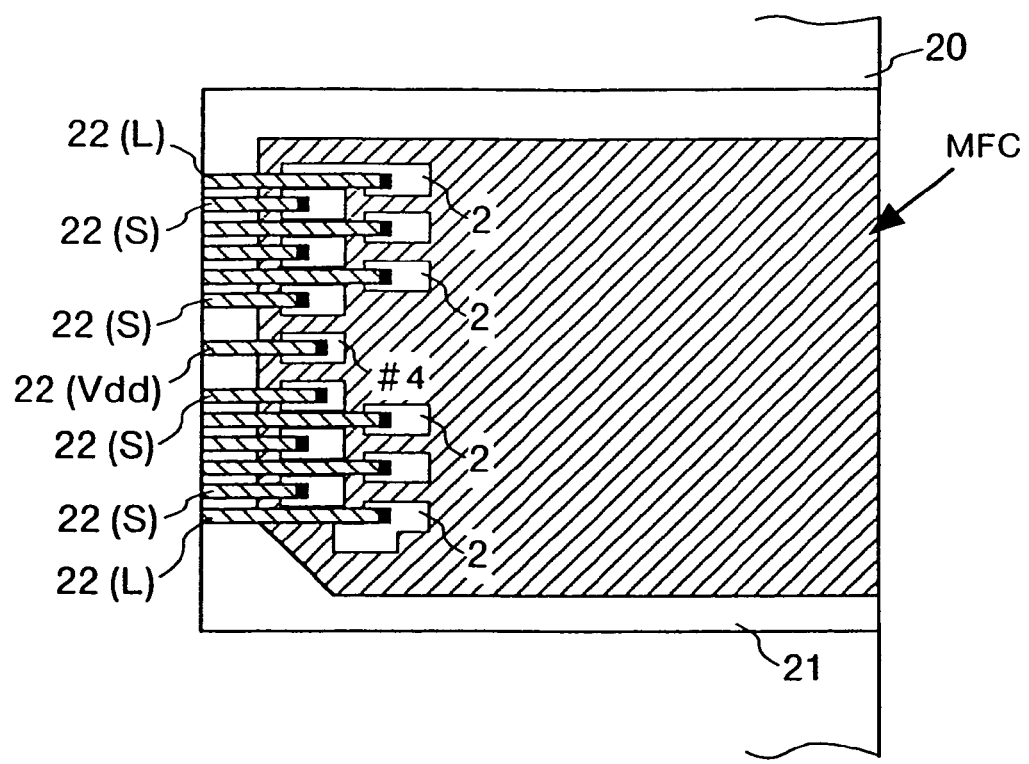
FIG. 6 is a plan view showing a state in which the multifunction IC card is mounted in a card slot.

FIG. 6 shows a state in which a multifunction IC card MFC is mounted in a card slot 21. The card slot 21 has, at its back, slot terminals 22 that protrude in association with respective connector terminals 2. Since the connector terminals 2 are disposed in two rows in the zigzag form, the slot terminals 22 (22(S)) of the card slot 21 short in the amount of protrusion thereof and the slot terminals (22(L)) long in the amount thereof may be alternated in a zigzag section. A comparatively simple configuration can be adopted wherein the slot terminals 22 are disposed in parallel on the whole while the amounts of protrusion of the slot terminals 22 are being changed. Points that contact the connector terminals 2, correspond to tip (■ mark) portions of the slot terminals 22.

Figure 7:
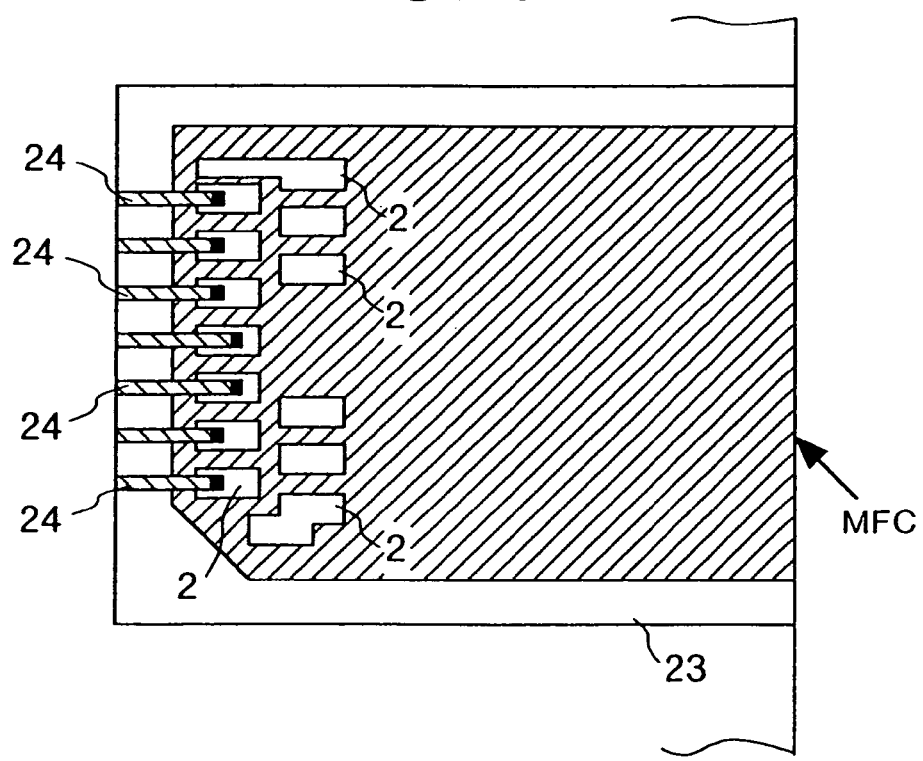
FIG. 7 is a plan view depicting a state in which a multifunction IC card is mounted in a card slot for a multimedia card.

FIG. 7 shows a state of mounting of a multifunction IC card MFC in a card slot 23 for a multimedia card. Since an array of connector terminals 2 of #1 through #7 of the multifunction IC card MFC is based on the multimedia card, the multifunction IC card MFC can be mounted in the card slot 23 for the multimedia card so as to match even an application that singly makes use of a memory card unit 3. Reference numerals 24 respectively indicate slot terminals of the card slot 23, to which the connector terminals 2 of #1 through #7 are connectable.

Figure 8:
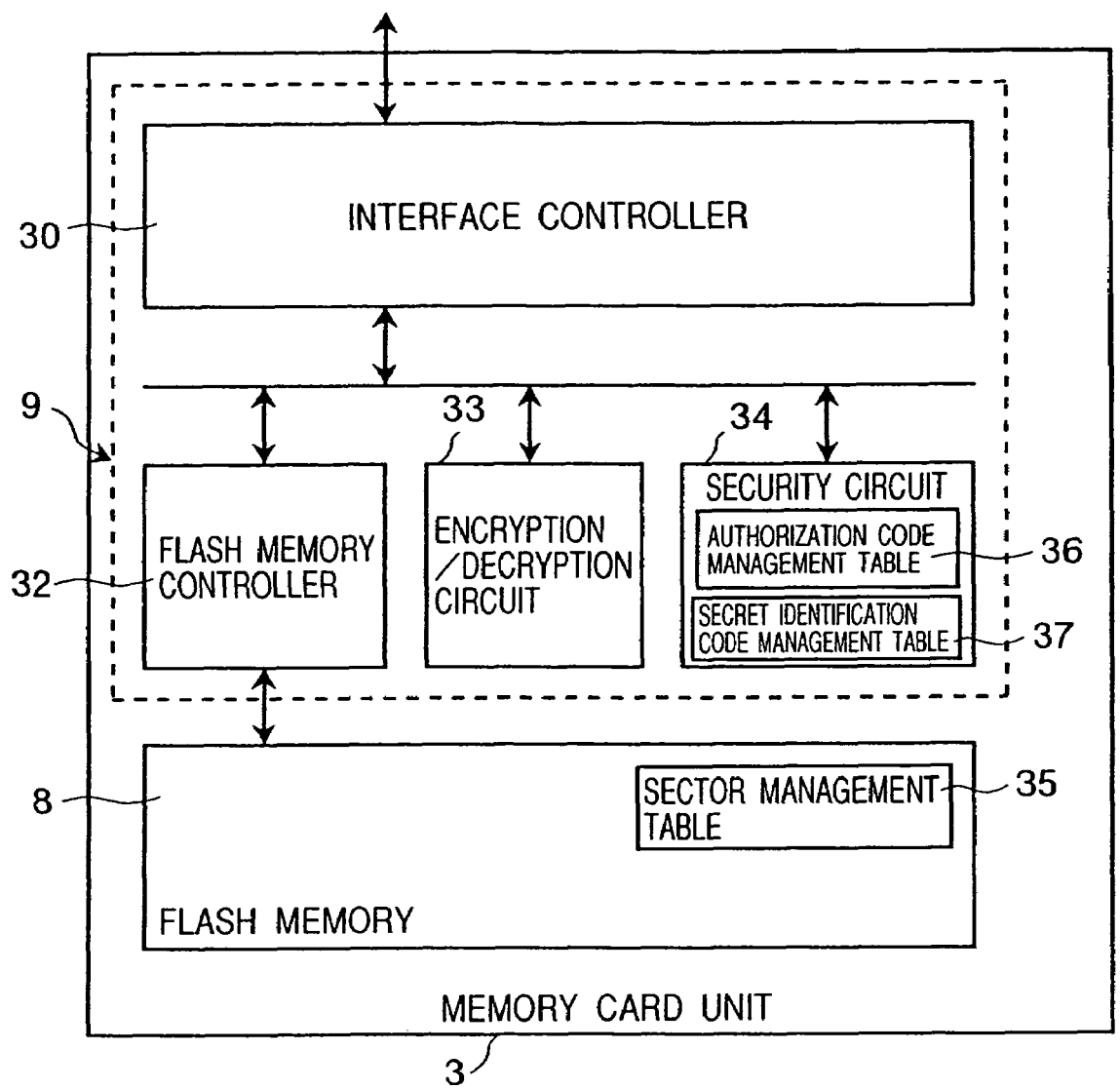
FIG. 8 is a functional block of a memory card unit.

A functional block diagram of the memory card unit 3 is shown in FIG. 8. A controller 9 has an interface controller 30, a flash memory controller 32, an encryption/decryption circuit 33, and a security circuit 34. The interface controller 30 is connected to a cellular phone 20 via the connector terminals 2 and decodes a command supplied from the cellular phone 20 to thereby control perform the general-control on the interior of the memory card unit 3 and control on an interface with the cellular phone 20. Although not restricted in particular, such a control program or state transition control logic is provided inside the interface controller 30. The control program may be placed in a flash memory 8.

The interface control is equivalent to interface control based on a multimedia card mode or an SPI mode via the connector terminals 2. The general control on the interior of the memory card unit includes authentication control using the security circuit 34 as the first, encryption/decryption control on input/output data of the flash memory 8 as the second, and access control made as for a file memory of the flash memory 8 via the flash memory controller 32.

The access control is control which takes into consideration compatibility with such a file system that, for example, a sector is basic to data management. In order to manage data or files in sector units of 512 bytes, for example, a memory array of the flash memory 8 is utilized with being divided into data areas set every 512 bytes corresponding to one sector and management areas set every data area. Each of the management areas includes information indicative of the use state of a sector, as to whether effective data is held in the corresponding data area, pointing information to a subsequent sector, etc. Those management areas constitute a sector management table 35 as a whole. Upon the access control, a sector of a file intended for access is associated with its corresponding physical address of the flash memory 8, so that each of memory operations such as read, erase, write and verify, etc. is performed.

The encryption/decryption control performs, for example, a process for causing the encryption/decryption circuit 33 to firstly encrypt data written into the flash memory 8 and allowing the encrypted data to be written into the flash memory 8, and a process for causing the encryption/decryption circuit 33 to decrypt data read from the flash memory 8 by the flash memory controller 32 or effecting another encryption on the data, and allowing the processed data to be outputted to the outside from the interface controller 30. A suitable algorithm using a private key or a private key and a public key may be adopted for an encrypting/decrypting method.

The authentication control will be explained. Assuming that the memory card unit 3 is used for delivery of music information, literature information, etc. through the cellular phone 20 or the like, copyright protection against such information may preferably be taken into consideration. When a telephone number or the like is stored in the memory card unit 3 and utilized, a request for execution of privacy protection against such information will be made.

Although not restricted in particular as to the copyright protection, a predetermined authorization code related to the right of reproduction is written into a specific area of the flash memory 8 in a manufacturing stage of the flash memory 8. Upon information delivery, the authorization code related to the reproduction right is transferred from a host device to the cellular phone 20 or the like. This is set to an authorization code management table 36 of the security circuit 34. The delivered information such as music information or the like associated with the authorization code is downloaded and written in the flash memory 8. Its write memory address is associated with the authorization code and set to the authorization code management table 36 of the security circuit 34. Thereafter, the multifunction IC card MFC is detached from the cellular phone 20 and attached to a reproduction terminal device or the like this time. In response to an access request sent from the terminal device, the interface controller 30 of the multifunction IC card MFC causes the security circuit 34 to determine, using the authorization code management table 36, whether a memory address of a file intended for access is a memory area associated with the authorization code on the authorization code management table 36. When the memory area is associated with the authorization code, the security circuit 34 disallows the file access unless a predetermined relationship between the authorization code held in the security circuit 34 and the authorization code written into the flash memory 8 at its manufacturing stage is established. The authorization code management table 36 may be made up of an electrically rewritable non-volatile memory. The authorization code management table 36 may be placed in the interface controller 30 or the flash memory 8.

Once a secret identification code is set from a device such as a cellular phone to a secret identification code management table 37 of the security circuit 34 if described as to privacy protection, the security circuit 34 requires the interface controller 30 to input the corresponding secret identification code upon a first read access request to the flash memory 8 each time an initializing process of the multifunction IC card MFC is finished. Until a secret identification code coincident with the secret identification code set to the secret identification code management table 37 is inputted from outside, the security circuit 34 causes the interface controller 30 to stop memory access control responsive to the read request. The secret identification code management table 37 may be made up of an electrically rewritable non-volatile memory. The authorization code management table 36 may be placed in the interface controller 30 or the flash memory 8.

Figure 9:
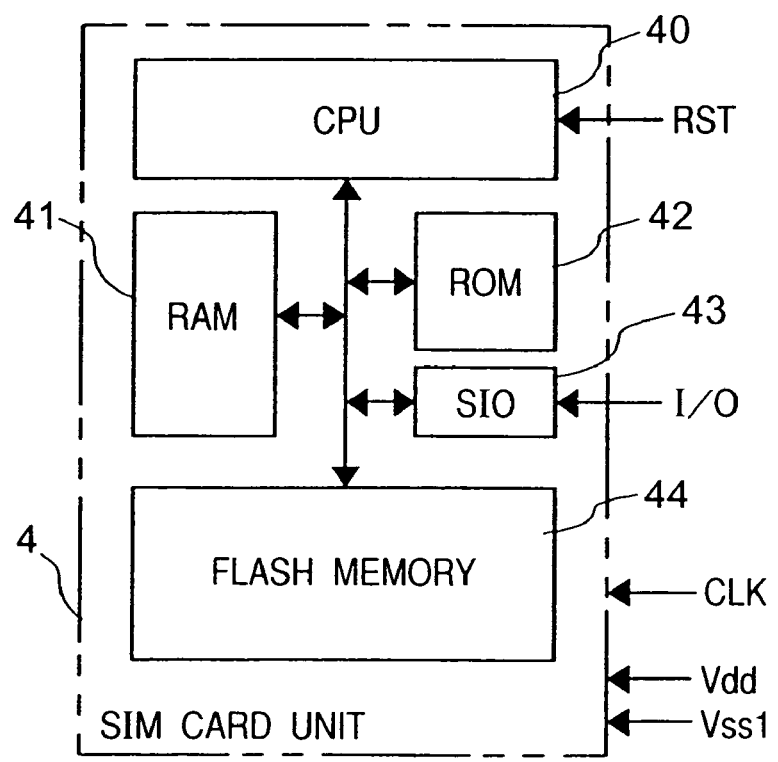
FIG. 9 is a functional block diagram of an SIM card unit.

A functional block diagram of the SIM card unit 4 is shown in FIG. 9. The SIM card unit 4 is realized by a single chip microcomputer and comprises a CPU (Central Processing Unit) 40, a RAM (Random Access Memory) 41 used as a work area of the CPU 40, a ROM (Read-Only Memory) 42 holding operating programs and the like for the CPU 40, a serial interface circuit (SIO) 43 for performing the input/output of data from and to the outside, and a flash memory 44. In a GSM mobile communication system, the SIM card unit 4 holds subscriber information necessary for support of a GSM operator and acknowledgement/management of GSM subscribers, such as storage/management of subscriber information about security, creation/management of user PIN (Personal Identification Number), etc. Further, the SIM card unit 4 holds account information, information necessary for GSM services like abbreviated dialing/destination fix dialing, etc. The CPU 40 performs a process for retaining these information in the flash memory 44 and managing them through the use of the RAM 41. An operating program for its execution is held in the ROM 42. Further, the SIM card unit 4 performs the implementation of communication protocols, file management and security management. The security management is to confirm the validity of use authority of a user and the validity of a use system through the use of an authentication code such as the user PIN. While a specific authentication procedure is not described in detail, a GSM service provider pre-stores an authentication code for the GSM services in the flash memory 44 of the SIM card unit 4 in a one-to-one correspondence with each user. The authentication code pre-registered in the SIM card unit 4 is used to make a decision as to the coincidence with a code inputted to the SIM card unit 4 for each call, for example. The validity is confirmed based on the result of its decision. A relationship with accounting also exists and hence a security level at the SIM card unit 4 is generally set higher than a security level at the memory card unit 3. In the multifunction IC card MFC, the SIM card unit 4 and the memory card unit 3 are respectively assigned inherent connector terminals as data input/output terminals. Therefore, the writing and reading of secret codes such security information to and from them can be performed independently. This makes it possible to execute transactions different from one another with respect to the security level. In other words, the difference in the security level is allowed as a difference upon multifunction.

Figure 10:
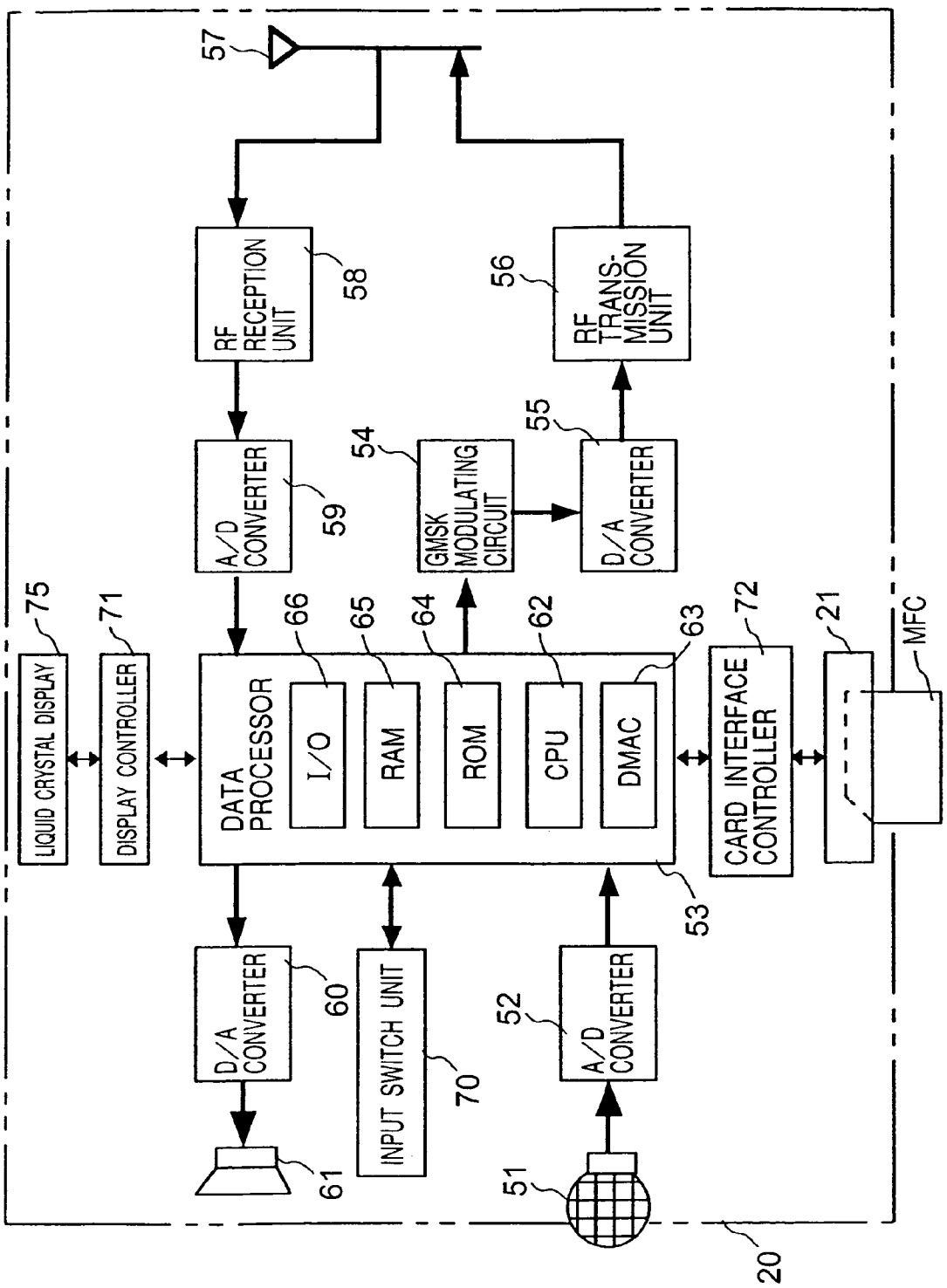
FIG. 10 is a functional block diagram of a cellular telephone capable of utilizing a multifunction IC card.

A functional block diagram of a cellular phone capable of utilizing a multifunction IC card MFC is shown in FIG. 10.

Voice is captured by a microphone 51 as an analog audio signal and converted into a digital audio signal by an A/D converter 52, followed by input to a data processor 53. The data processor 53 effects a voice coding process and a channel codec process or the like as a layer process on the received digital audio signal and outputs the processed signal as a transmit signal. Although not restricted in particular, the voice coding process and channel codec process or the like are performed using a DSP. Although not illustrated in particular, the data processor 53 may build therein an accelerator for the channel codec and voice codec.

The transmit signal generated by the data processor 53 is modulated by, for example, a GMSK modulating circuit 54 and further converted into an analog signal by a D/A converter 55, which in turn is transmitted from a high-frequency transmission unit (RF transmission unit) 56 through an antenna 57.

A signal received by the antenna 57 is received by a high-frequency reception unit (RF reception unit) 58 and converted into a digital signal by an A/D converter 59, after which it is brought to the data processor 53. The data processor 53 performs a Viterbi decoding process, a voice decoding process, etc. to take out a voice or audio signal and outputs it therefrom. The Viterbi decoding process, voice decoding process and the like are performed by the DSP or the unillustrated accelerator.

The audio signal outputted from the data processor 53 is converted into an analog audio signal by a D/A converter 60, which is outputted as the voice through a speaker 61.

The data processor 53 in the cellular phone 20 shown in FIG. 10 includes a central processing unit (CPU) 62, a direct memory access controller (DMAC) 63, a read-only memory (ROM) 64 holding operating programs or the like for the CPU 62, a random access memory (RAM) 65 used in a work area of the CPU 62, and an input/output circuit (I/O) 66 such as an input/output port, a serial interface or the like. In the example of the cellular phone 20, although not restricted in particular, operating programs such as a voice codec process for voice encoding/decoding, a channel codec process as a layer process, and a system control process or the like executed by the data processor 53 are held in the ROM 64. A process for setting a transfer control condition for the DMAC 63 is performed by executing the corresponding operating program stored in the ROM 64 by the CPU 62.

Although not restricted in particular, an input switch unit 70, a display controller 71 and a card interface controller 72 are connected to the I/O 66 of the data processor 53. The input switch unit 70 includes a large number of input switches capable of inputting figures and characters or the like by function designations. The card interface controller 72 performs interface control between a multifunction IC card MFC mounted in a card slot 21 and a data processor 53. The data processor 53 has the function of performing control for suitably displaying, on a liquid crystal display 75 via the display controller 71, states of the cellular phone 20, such as a transmit telephone number, an incoming telephone number, a communication state, a battery voltage, etc.

<<Multibank Memory Card>>

Figures 11, 12:
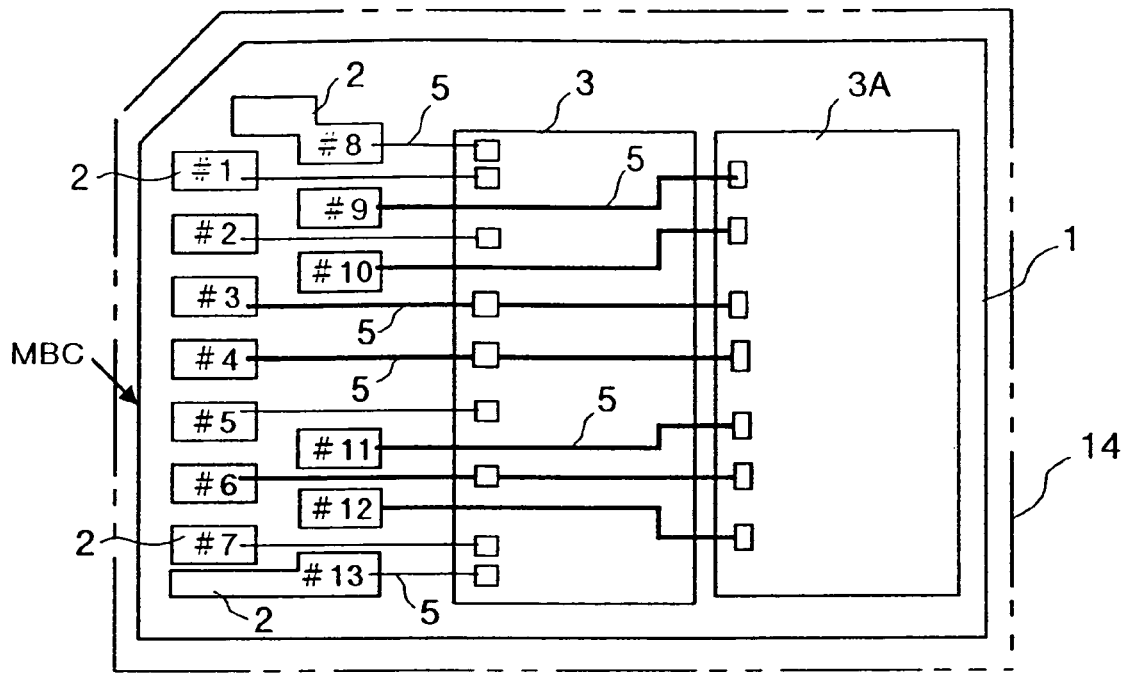
FIG. 11 is an explanatory view showing a configuration of a multibank memory card illustrative of a second example of an IC card according to the present invention with a form of connections between connector terminals and circuit units as a principal base.
FIG. 12 is an explanatory view illustrating a list of connector terminal functions of the multifunction IC card shown in FIG. 11.

FIG. 11 shows a configuration of a multibank memory card illustrative of a second example of an IC card according to the present invention with a form of connections between connector terminals and circuit units as a principal base.

The multibank memory card MBC shown in FIG. 11 has an array similar to the multifunction IC card MFC shown in FIG. 1. Connector terminals 2 of #1 through #13 provided in a zigzag form are disposed on a card substrate 1 in two rows. Memory card units 3 and 3A are connected to the connector terminals 2 of #1 through #13 so as to constitute a parallel-operable multibank memory. Reference numerals 5 indicate connecting wirings that show a generic designation for wiring patterns, bonding wires, etc. for connecting the memory card units 3 and 3A to the connector terminals 2.

The memory card unit 3 is connected to the connector terminals 2 of #1 through #8 and #13 and has the same configuration as the memory card unit 3 of the multifunction IC card MFC shown in FIG. 1. Thus, the memory card unit 3 is operable as a multimedia card as shown in the column of 7 pin (1 bit) of FIG. 12 in the same manner as described above. Further, the memory card unit 3 is capable of performing an input/output operation of 4-bit parallel data in a manner similar to an SD card as shown in the column of 9 pin (4 bit) of FIG. 12. Operating modes thereof are determined according to the states of the connector terminals 2 when connected to a card slot as described above. A multimedia card mode and an SPI mode for multimedia card compatible operating modes are determined according to the designations at on-initialization for the memory card unit 3 by a host device as described above.

The memory card unit 3A is provided only with a function as a memory card capable of performing only a 1-bit serial input/output based on the multimedia card. The memory card unit 3A is supplied with a ground voltage Vss1, a power supply voltage Vdd and a ground voltage Vss2 from the connector terminals of #3, #4 and #6 shared with the memory card unit 3. In the multimedia card mode, #9 functions as a reserve terminal NC-2 (open or fixed to a logical value "1"), #10 functions as a command terminal CMD-2 (which performs the input of a command and the output of a response signal), #11 functions as a clock input terminal CLK-2, and #12 functions as a data input/output terminal Data-2, respectively. In the SPI mode, #9 functions as a chip select terminal CS-2 (negative logic), #10 functions as a data input terminal Din-2 (used for the input of data and a command from the host device to the card), #11 functions as a clock input terminal CLK-2, and #12 functions as a data output terminal Dout-2 (which performs the output of data and status from the memory card to the host device), respectively. The multimedia card mode and the SPI mode are determined depending on the designations at the initialization for the memory card unit 3A by the host device as described above.

When the multibank memory card MBC shown in FIG. 11 is mounted in a card slot 21 having 13 slot terminals 22 as illustrated in FIG. 6 to interface with the host device, operating modes capable of being introduced into the respective memory card units 3 and 3A when the two memory card units 3 and 3A are operated in parallel, are firstly a form for setting both to a multimedia card mode or an SPI mode in multimedia card compatible modes as illustrated in the column of 13 pin (A) of FIG. 12. Secondly, as illustrated in the column of 13 pin (B) of FIG. 12, operating modes are a form for setting the memory card unit 3 to an operating mode capable of performing a 4-bit parallel input/output, and a form for setting the memory card unit 3A to a multimedia card mode in the multimedia card compatible modes. In any case, the host device is capable of controlling both the memory card units 3 and 3A included in one IC card independent of each other and enables even a parallel operation thereof perfectly.

<<Prevention of Power-to-Power Short>>

In the multifunction IC card MFC shown in FIG. 1 and the multibank memory card MBC shown in FIG. 11, consideration to the prevention of a power-to-power short has been made to the array of the connector terminals 2 in two rows back and forth. In the above-described example, no terminal is disposed in the rear of the terminal of #4 corresponding to a power supply connector terminal. At the section in which the connector terminals 2 are disposed in the zigzag form as illustrated in FIG. 6, the short terminals 22(S) and the long terminals 22(L) in the slot terminals 22 of the card slot 21 are alternately densely disposed with pitches each equivalent to one-half the pitch of each connector terminal 2. On the other hand, if no connector terminals 2 exist in the rear as in the case of #4, then the long slot terminals 22(L) are not disposed on both sides of the slot terminal 22(Vdd) corresponding to the connector terminal 2 of #4 for the supply of the power supply voltage (Vdd) as illustrated in FIG. 6.

Let's assume an IC card 25 wherein as illustrated in FIG. 13(A) on the contrary, data terminals of #10 and #11 are disposed in the rear of a connector terminal of #4 for the supply of a power supply voltage (Vdd). In a card slot 26 corresponding to the IC card 25, a long slot terminal 26Ab is disposed adjacent to a slot terminal 26Aa corresponding to the connector terminal of #4.

When the IC card 25 of FIG. 13 is inserted into the card slot 26, a contact point (■ mark portion) of the slot terminal 26Ab is brought into sliding contact with the surfaces of the connector terminal of #4 inputted with the power supply voltage Vdd and a connector terminal of #3 inputted with a circuit ground voltage Vss as illustrated in FIG. 13(B). When, at this time, the slot terminal 26Aa supplied with the power supply voltage Vdd is made conductive to the connector terminal of #4, and the slot terminal 26Ac supplied with the circuit ground voltage Vss is made conductive to the connector terminal of #3, the power supply voltage Vdd and the ground voltage Vss are short-circuited via a contact point of 26Aa, a contact point between #4 and 26Ab and a contact point between #3 and 26Ac as shown in FIG. 13(C).

Owing to the non-provision of the connector terminal in the rear of the terminal of #4 corresponding to the power supply connector terminal as illustrated in FIG. 6, the possibility of such power short can be prevented before happens.

While the invention made above by the present inventors has been described specifically based on the illustrated embodiments, the present invention is not limited to them. Various changes can be made thereto within the scope not departing from the substance thereof.

For example, the present invention can be applied even to a memory card excluding outer specs of a multimedia card, e.g., an IC card based on other standard, such as a compact flash memory or the like. Accordingly, the size of a card substrate, the number of connector terminals, and the functions of the connector terminals, etc. are not limited to the above-description and can be suitably changed. A memory mounted to an IC card of the present invention is not limited to a non-volatile memory. The memory may be volatile memories (SRAM, DRAM, etc.). The non-volatile memory is not limited to the flash memory and may be a ferroelectric memory.

INDUSTRIAL APPLICABILITY

The present invention can be used in a cellular phone such as a GSM, and other personal digital assistants as a multifunction IC card. Also the present invention can be widely used in an auxiliary storage or the like for each of a digital video camera, a digital still camera and other electronic equipment as a multibank memory IC card. Further, the function of a bankbook, a credit card, an IC card or the like can be also incorporated together with a memory function as the function of the multifunction IC card.

The invention claimed is:

1. A semiconductor device comprising:
a first semiconductor chip configured to perform a first authentication function of a first security level;
a second semiconductor chip configured to perform a second authentication function of a second security level different from said first security level; and
a nonvolatile memory,
wherein the first semiconductor chip is configured for controlling a data storage function for storing data to said nonvolatile memory, and performing said first authentication function to access to said data stored into said nonvolatile memory, and
wherein said second semiconductor chip is configured for performing said second authentication function in response to receiving an electrical signal from outside of the semiconductor device.

2. A semiconductor device according to claim 1, further comprising a plurality of terminals,
wherein said first semiconductor chip is coupled to ones of said plurality of terminals, and is configured for receiving a command and inputting/outputting data via said ones of plurality of terminals,
wherein said second semiconductor chip is coupled to others of said plurality of terminals, and is configured for receiving a command and inputting/outputting data via said others of said plurality of terminals.

3. A semiconductor device according to claim 2,
wherein said first authentication function is for protection of copyright, and
wherein said second authentication function is for management of a cellular phone.

4. A semiconductor device according to claim 3,
wherein said second semiconductor chip comprises a program memory for storing a program which is used for performing said second authentication function.

5. A semiconductor device according to claim 1,
wherein the security level of said second authentication function is higher than the security level of said first authentication function.

6. A semiconductor device according to claim 5,
wherein said first authentication function is for memory card access and said second authentication function is for SIM card access.

* * * * *